United States Patent
Morris

(10) Patent No.: US 6,259,282 B1
(45) Date of Patent: Jul. 10, 2001

(54) EXTERNAL PULL-UP RESISTOR DETECTION AND COMPENSATION OF OUTPUT BUFFER

(75) Inventor: Bernard Lee Morris, Emmaus, PA (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/641,085

(22) Filed: Aug. 17, 2000

(51) Int. Cl.[7] ....................................... H03K 3/00
(52) U.S. Cl. ................... 327/112; 327/108; 327/362; 326/58
(58) Field of Search .................. 327/362, 108, 327/112, 437; 326/56, 57, 58

(56) References Cited

U.S. PATENT DOCUMENTS

| | | | |
|---|---|---|---|
| 5,864,244 | * | 1/1999 | Kaplinsky .............................. 327/215 |
| 5,905,389 | * | 5/1999 | Alleven ................................ 327/112 |

* cited by examiner

*Primary Examiner*—Dinh T. Le
(74) *Attorney, Agent, or Firm*—Mark A. Kurisko

(57) ABSTRACT

A system and method that compensates for a pull-up resistor coupled to a buffer, when the pull-up resistor has an unknown resistance value. The system includes a buffer and a parameter detector. The buffer receives an input signal at a buffer input, and the buffer generates a buffered signal at a buffer output. The parameter detector measures a parameter at the buffer output when the buffer is in a high impedance output state, and the parameter detector generates a buffer control signal based upon the measured parameter. The buffer responds to the buffer control signal generated by the parameter detector.

30 Claims, 5 Drawing Sheets

FIG. 4 is a schematic diagram showing a step-down converter feature of the invention of FIG. 1; and FIG. 5 is a schematic diagram showing the invention of FIG. 4 with a source follower.

EXTERNAL PULL-UP RESISTOR DETECTION AND COMPENSATION OF OUTPUT BUFFER

BACKGROUND OF THE INVENTION

Integrated Circuit output buffers are often coupled to an off-chip pull-up resistor. This pull-up resistor will effect the performance of the output buffer, since it speeds up the low-to-high transition and slows down the high-to-low transition of signals output by the buffer. For buffers having very tight specifications on rise and fall times, or on duty cycle distortion, the performance changes caused by the pull-up resistor are problematic. The usual solution is to design a buffer that compensates for a known pull-up resistor having a defined resistance value, so that the performance distortion caused by the known pull-up resistor is reduced.

However, there are some systems, such as the ATA bus widely used in Mass Storage applications, where the value of the pull-up resistor is unknown and can vary widely. This variation in pull-up resistor value adversely affects the performance of output buffers because the output buffers are not designed to accurately account for distortions caused by a pull-up resistor having an unknown or variable resistance. The inability of known output buffers to account for pull-up resistors having an unknown value only gets worse as the speed of data transmission increases, since the percentage of distortion increases as the pulse width narrows.

Accordingly, there exists a need for an improved output buffer that accounts for pull-up resistors having an unknown or variable resistance.

SUMMARY OF THE INVENTION

This invention overcomes the problems in conventional systems by providing for a buffer circuit capable of measuring, and responding to, a parameter at a buffer output, such as the value of a pull-up resistor. The invention, in accordance with one aspect, includes an electronic circuit including a buffer and a parameter detector. The buffer receives an input signal at a buffer input, and the buffer generates a buffered signal at a buffer output. The parameter detector measures a parameter at the buffer output when the buffer is in a high impedance output state, and the parameter detector generates a buffer control signal based upon the measured parameter. The buffer responds to the buffer control signal generated by the parameter detector.

Another aspect of the invention provides for a method of calibrating a buffer. The method includes the steps of placing the buffer in a high impedance output state, measuring a parameter at the buffer output, and adjusting the buffer based upon the measured parameter. In accordance with this aspect of the invention, the parameter at the buffer output is measured while the buffer is in a high impedance output state.

BRIEF DESCRIPTION OF DRAWINGS

The features and advantages of the invention will be apparent from the following description, as illustrated in the accompanying Figures in which like reference characters refer to the same elements throughout the different Figures.

DETAILED DESCRIPTION

Figure 1:
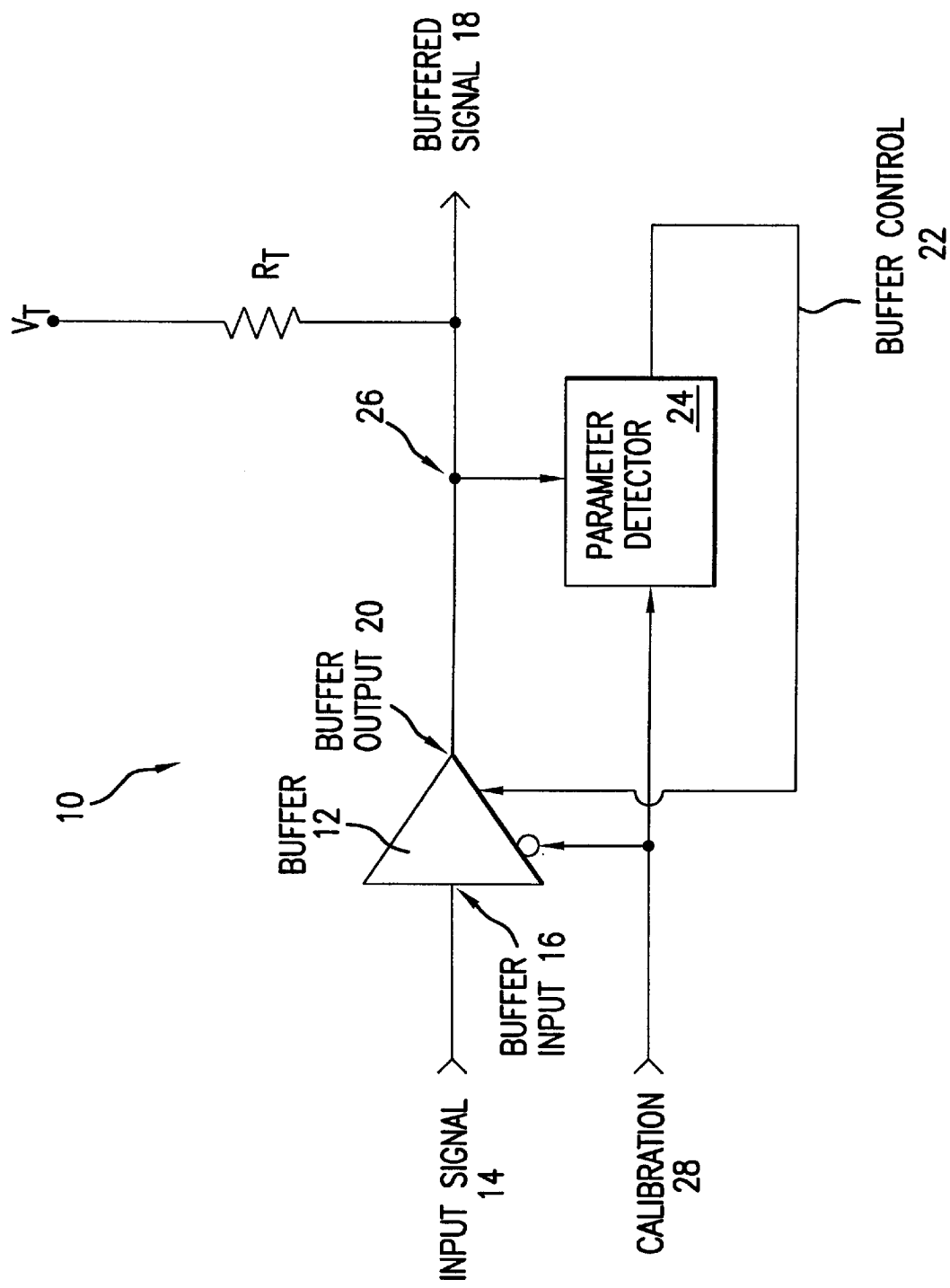
FIG. 1 is a block diagram of an electronic circuit according to the invention.

FIG. 1 illustrates a block diagram of an electronic circuit 10 according to the invention. The electronic circuit 10 includes a buffer 12 and a parameter detector 24. The buffer 12 receives an input signal 14 at a buffer input 16, and the buffer 12 generates a buffered signal 18 at a buffer output 20. The parameter detector 24 measures a parameter at the buffer output 20 when the buffer 12 is in a high impedance output state, and the parameter detector 24 generates a buffer control 22 signal based upon the measured parameter. The buffer 12 responds to the input signal 14 and to the buffer control signal 22 generated by the parameter detector 24.

The term "buffer" as used herein refers to an isolating circuit used to prevent a driven circuit from influencing a driving circuit. Buffers include unity gain buffers that produce an output signal equal in magnitude to an input signal.

In operation, the buffer 12 is calibrated by placing the buffer 12 in a high impedance output state, measuring a parameter at the buffer output 20, and adjusting the buffer 12 based upon the measured parameter. In addition, the step of measuring the parameter should occur while the buffer 12 is in a high impedance output state. A calibration signal 28 can be used to both trigger a high impedance state for the output buffer 12 and to trigger the measurement of a parameter by the parameter detector 12. The parameter detector measures a specified electrical characteristic, such as voltage, current, or resistance, at the buffer output in order to determine the strength of the pull-up resistor $R_T$. Through the use of the buffer 12 and the parameter detector 24, the electronic circuit 10 provides for the ability to calibrate the buffer 12 to a pull-up resistor $R_T$ having an unknown resistance, terminated to a voltage VT. After the buffer 12 is properly calibrated, the adverse affects of the pull-up resistor's unknown resistance are substantially reduced.

Figure 2:
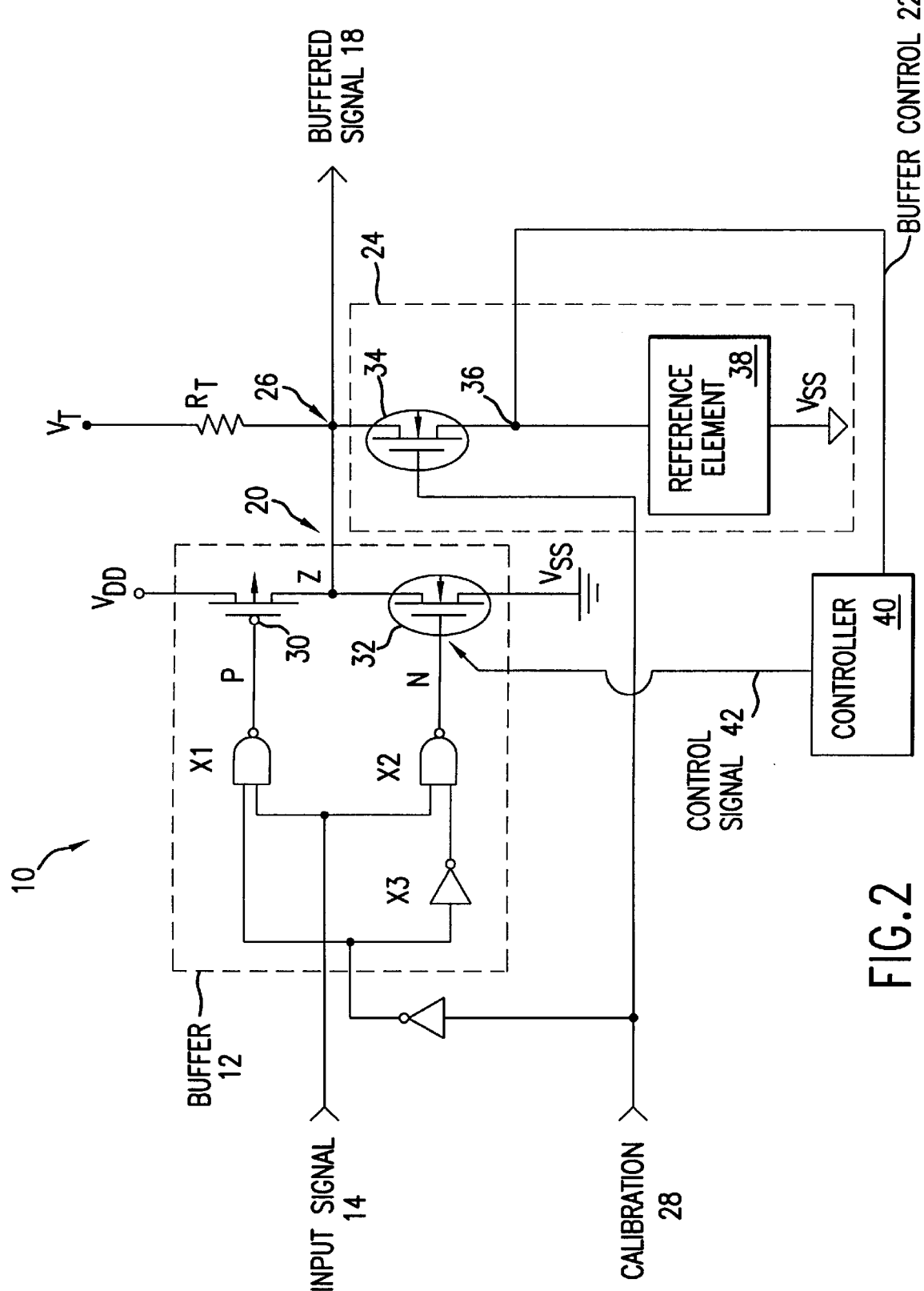
FIG. 2 is a mixed block and schematic diagram showing further details of the invention of FIG. 1.

FIG. 2 is a mixed block and schematic diagram showing further details of the electronic circuit 10 of FIG. 1. The buffer 12, as shown in FIG. 2, can be a tri-statable CMOS output buffer. The exemplary buffer 12 shown in FIG. 2 can include a NAND gate X1, a NOR gate X2, an inverter X3, and an output stage formed of a transistor 30 and a transistor 32 serially connected between a voltage level $V_{dd}$ and another voltage level $V_{SS}$. The buffer can also include an extra input for the Calibration signal 28. The Calibration signal 28 can then be operably coupled to the gate of the N-channel transistor 34.

In operation, when the calibration signal 28 is high, the input signal 14 drives NAND gate X1 and NOR gate X2 in such a way that when input signal 14 is high nodes N and P are low. This turns off the N-channel transistor 32 and turns on the P-channel transistor 30, pulling an output node 26 up to $V_{dd}$. The off-chip resistor RT aids the pull-up of the output node 26. When input signal 14 is low, then nodes N and P are high. This turns on transistor 32 and turns off transistor 30, pulling the output node 26 down to $V_{SS}$. In this case, the resistor RT fights this pull-down.

The resistor terminates in a voltage VT. This voltage may be equal to $V_{dd}$, or it may be appreciably greater. When the calibration input 28 is high, node N is low and node P high regardless of the state of the input signal 14. This causes both transistors 30 and 32 to be turned off, and is called the high impedance output state of the buffer 12. In the high impedance output state, the pull-up resistor $R_T$ is free to pull output node 26 up to the termination voltage VT.

FIG. 2 further illustrates that the parameter detector 24 can include a switch 34. The switch 34 can be a transistor. The switch 34 selectively couples the buffer output 20 to a circuit path 36 in the parameter detector 24 so that a parameter of the buffer output 20 can be measured. Preferably, the switch 34 selectively couples the output 20 and the circuit path 36 in response to the calibration signal 28. The switch 34 can also include a high impedance coupling to the buffer output 20. The high impedance coupling prevents the parameter detector 24 from substantially distorting the buffered signal 18 while the calibration signal 28 is disabled.

The parameter detector 24 can also include a reference element 38 being operably coupled to the switch 34. The reference element provides for a known baseline to compare a measured parameter with, and thereby determine the value and strength of the pull-up resistor $R_T$. The reference element can be a known resistance value, a known current source, a known voltage source, or a combination of the aforementioned items. If the reference element 38 is a known resistor having a resistance value RCONT, then the output node 26 will be at voltage VZ, where VZ=VT * (RT/(RT+RCONT)). Alternately, the reference element 38 can be a current source with a known current ICS. In this case, VZ=VT−(ICS*RT). In either case, measuring a parameter at the buffer output, such as the voltage VZ at node 26 or node 36, will directly determine the strength of the pull-up resistor.

For example, when the reference element 38 has a known resistance RCONT then the resistors $R_T$ and RCONT form a voltage divider between the known voltages VT and $V_{SS}$. Once the buffer 12 is put into a high impedance state, the parameter detector 24 can then measure the voltage at node 26 or node 36 and generate an appropriate buffer control signal 22 indicative of the effect of the pull-up resistor $R_T$ on the buffered signal 18.

Once the effect of the pull-up resistor $R_T$ is identified, the buffer 12 can then respond to the measured voltage by changing the relative strength of any of the elements of the output buffer. Circuits that change the strength of output buffers in response to an applied signal are known to those skilled in the art.

The electronic circuit 10, as shown in FIG. 2, can also include a controller 40 operably coupled between the buffer 12 and the parameter detector 24. The controller can be located inside or outside the parameter detector 24. The controller 40 generates a control signal 42 to the buffer based upon the measured parameter. The controller 40 is representative of a circuit that aids the buffer in changing its relative strength in response to the effect of the pull-up resistor RT. For instance, the controller can be a voltage to digital converter or a current to a digital converter.

In one aspect of the invention, the controller 40 is a voltage to digital (e.g. Analog to Digital) to converter. The controller 40 converts the analog voltage in buffer control signal 22 into a digital control signal 42. The digital control signal 42 can be an N-bit control signal Fn (i.e. having individual control bits F0, F1, . . . Fn). The digital control signal 42 can be adjusted such that when there is no pull-up resistor, all values of the control signal Fn are low, but as the pull-up strength of the resistor increases more of the bits of the control signal Fn go high. The digital control signal 42 can then be used to turn on, or turn off, "N" elements in the buffer 12, each of which can modify the driving strength of the buffer 12.

Further in accordance with this aspect of the invention, the transistor 32 of buffer 12 can include a plurality of parallel transistors (not shown). The plurality of parallel transistors can have a common source and drain, but the plurality of parallel transistors can also have gates driven by AND gates whose inputs are the signals N (i.e. the output of Nor gate X2) and Fn. Thus, in operation, as the pull-up strength of $R_T$ increases, more of the control bits in control signal 42 go high thereby selectively engaging at least one of the plurality of transistors so that the effective size of transistor 32 increases. This increased size of transistor 32 will compensate for the pull-up resistor $R_T$. Similarly, the control signal 42 can be used to adjust the relative strengths of other elements in buffer 12, such as transistor and gates X1 and X2.

Figure 3:
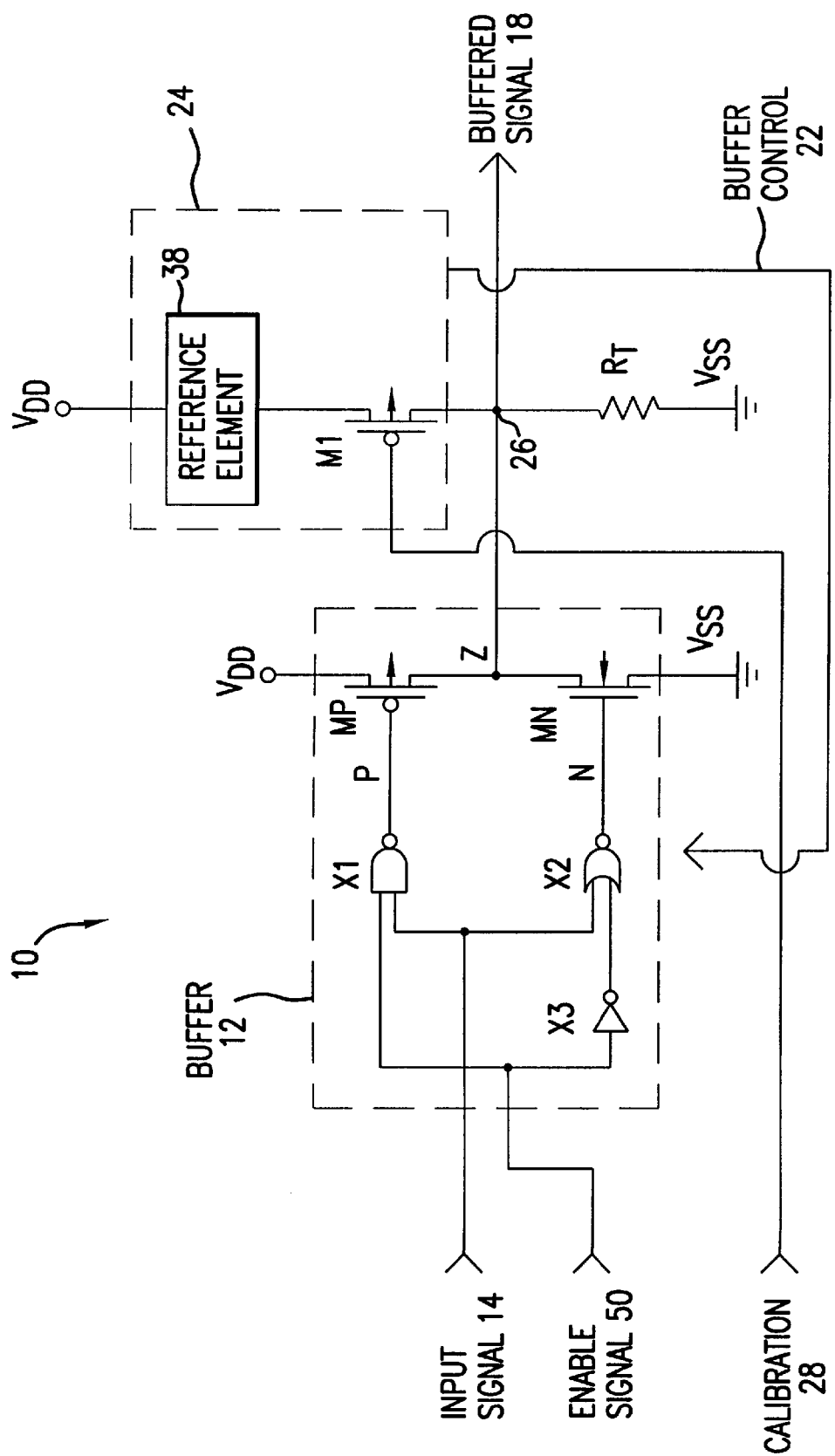
FIG. 3 is a mixed block and schematic diagram illustrating alternative features of the invention of FIG. 1.

FIG. 3 is a mixed block and schematic diagram illustrating alternative features of the electronic circuit 10. In FIG. 3, the reference element 38 is operably coupled between the node 26 and a high voltage signal $V_{dd}$, while the resistor $R_T$ having the unknown resistance value is operably coupled between the node 26 and a low voltage signal $V_{SS}$. $R_T$ is an external resistor that pulls the node 26 down to VSS when the buffer is in the high impedance state. Thus, FIG. 3 shows that the effects of pull-down resistors can also be measured and accounted for by the electronic circuit 10.

Under additional aspects of the invention, as shown in FIG. 3, an enable signal 50 can be used to trigger the high impedance state in the buffer 12. The calibration signal 28, as shown in FIG. 3, is only used to control the parameter detector 24. Typically, the enable signal 50 and the calibration signal 28 will be synchronized in order to ensure that the parameter detector 24 measures a parameter at the output buffer while the buffer 12 is in a high impedance state.

Figure 4:
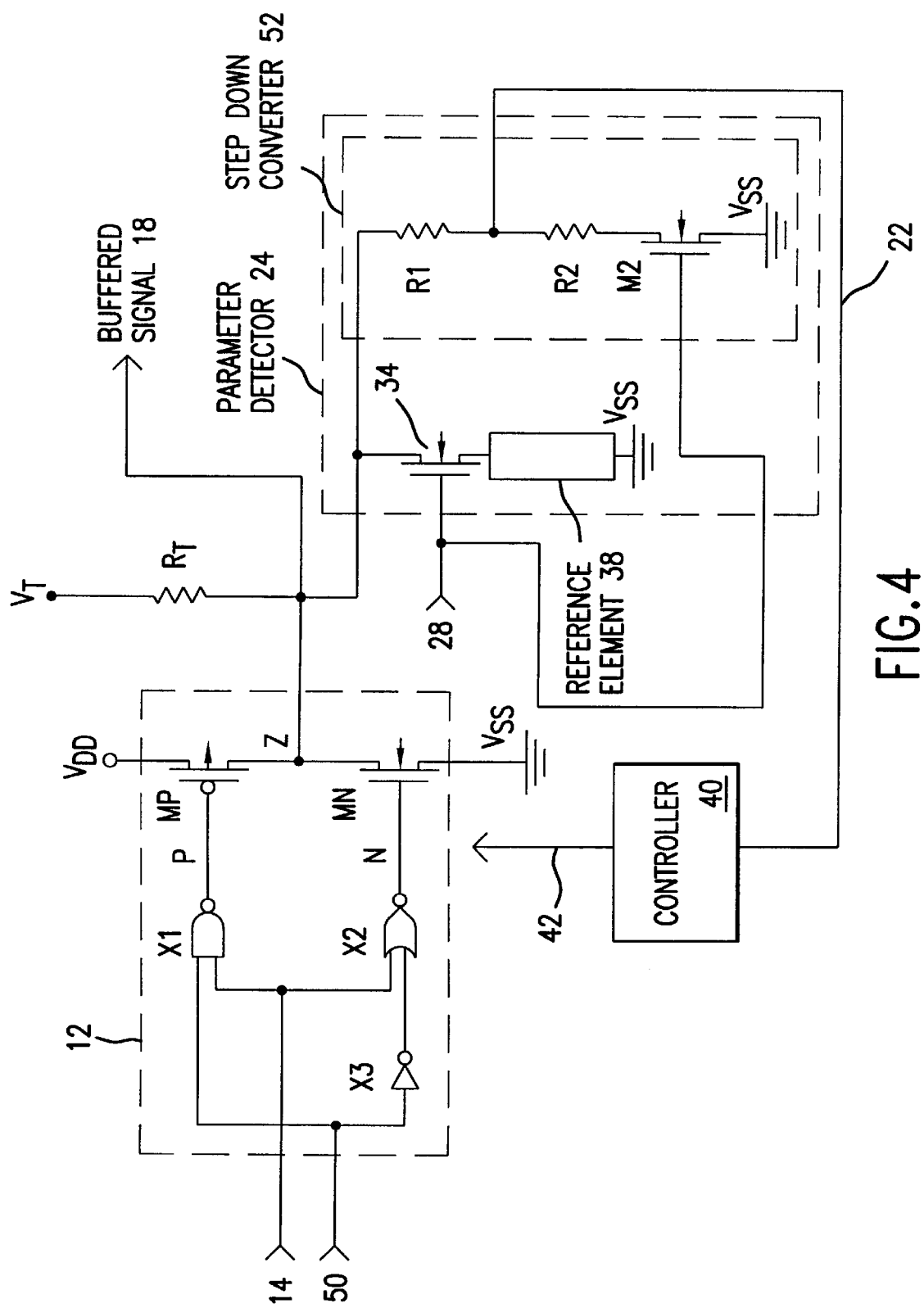

FIG. 4 illustrates an electronic circuit 10 wherein the parameter detector 24 includes a step-down converter 52. The step-down converter 52 includes circuitry for reducing the voltage level output by the parameter detector. As shown in FIG. 4, the step-down converter 52 can include a resistor R1, a resistor R2, and a switch M2. The resistors R1 and R2 act as a voltage divider, while the switch M2 is used to activate the step-down converter 52 in response to the calibration signal 28.

The step-down converter 52 is preferably utilized when the voltage VT is appreciably greater than the voltage $V_{dd}$. The step-down converter 52 reduces the voltage level output by the parameter detector to prevent damage to other circuits in the electronic circuit 10. For instance, the step-down converter 52 can reduce the voltage level of signal 22 to prevent damage, or out of range voltage inputs, to the controller 40.

Figure 5:
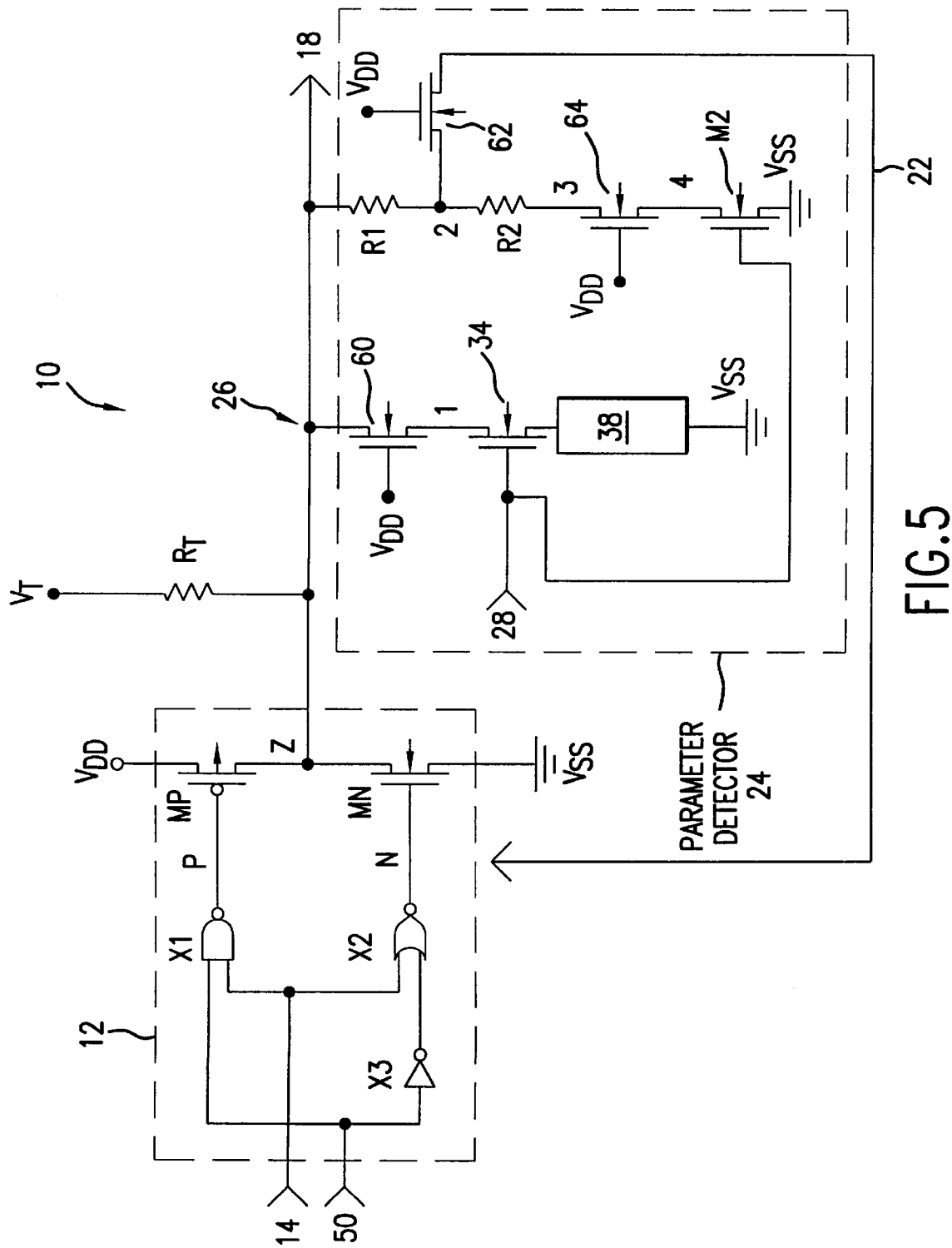

FIG. 5 shows an electronic circuit 10 wherein the parameter detector 24 includes at least one source follower in the parameter detector 24. In particular, the illustrated electronic circuit 10 includes source follower 60, 62 and 64 in the parameter detector 24.

Each source follower ensures that the voltage across an associated MOS transistor's gate or source-to-drain does not exceed a specified voltage limit, such as 3.3 volt. Each of the source followers 60, 62, 64 illustrated in FIG. 5 include a transistor having their gates coupled to the power supply $V_{DD}$, assumed to be 3.3 volts in this example. Each of the transistors prevents the voltages below them from rising above $V_{DD}-V_{tn}$, where $V_{tn}$ is the N-channel threshold voltage, about 0.7 volts.

The source followers are preferably used when the termination voltage VT exceeds the safe operating range of the circuit technology being used. For example, a 5 volt VT can exceed the safe operating range of CMOS circuit technology being operated with a 3.3 volt power supply $V_{dd}$. Thus, when VT pulls node 26 up to 5 volts, the gates of transistor 34 and transistor M2 could be subjected to a damaging 5 volt signal. The source followers 60 and 64 prevent their associated transistors 34 and M2, respectively, from being subjected to the damaging 5 volt signal by clamping the 5 volt signal to $V_{dd}$. In addition, the source follower 62 protects circuitry in the buffer 12 or in the controller 40 from seeing a potentially damaging 5 volt signal.

Having thus described a few particular embodiments of the invention, various alterations, modifications, and improvements will readily occur to those skilled in the art. Such alterations, modifications and improvements as are made obvious by this disclosure are intended to be part of this description though not expressly stated herein, and are intended to be within the spirit and scope of the invention. Accordingly, the foregoing description is by way of example only, and is not limiting.

What is claimed is:

1. An electronic circuit, comprising:
   a buffer that receives an input signal at a buffer input and that generates a buffered signal at a buffer output, the buffer being responsive to the input signal and to a buffer control signal, and
   a parameter detector that measures a parameter at the buffer output when the buffer is in a high impedance output state and that generates the buffer control signal based upon the measured parameter.

2. The electronic circuit according to claim 1, wherein the buffer generates a buffered signal having a voltage level based upon the buffer control signal and the voltage level of the input signal.

3. The electronic circuit according to claim 1, wherein the buffer is a tri-stable CMOS buffer circuit.

4. The electronic circuit according to claim 1, wherein the buffer enters a high impedance output state in response to a calibration signal.

5. The electronic circuit according to claim 3, wherein the buffer includes an output stage formed of two transistors in series between a voltage level $V_{dd}$ and another voltage level $V_{ss}$.

6. The electronic circuit according to claim 5, wherein at least one of the transistors in the output stage is formed of a plurality of parallel transistors having a common source and a common drain.

7. The electronic circuit according to claim 6, wherein the plurality of parallel transistors are selectively engaged based upon the buffer control signal.

8. The electronic circuit according to claim 1, wherein the parameter detector further includes a switch that selectively couples the buffer output to a circuit path in the parameter detector in response to a calibration signal.

9. The electronic circuit according to claim 8, wherein the switch has a high impedance coupling to the buffer output, such that the parameter detector does not substantially distort the buffered signal while the calibration signal is disabled.

10. The electronic circuit according to claim 8, wherein the parameter detector includes a reference element operably coupled to the switch.

11. The electronic circuit according to claim 10, further including a controller operably coupled to the reference element for measuring a parameter at the buffer output and for generating a control signal based upon the measured parameter.

12. The electronic circuit according to claim 11, wherein the controller includes circuitry for measuring the voltage across the reference element and for generating a control signal representative of the voltage measured across the reference element.

13. The electronic circuit according to claim 10, wherein the reference element is selected from the group consisting of: a resistor, a current source, and a voltage source.

14. The electronic circuit according to claim 1, wherein the buffer control signal includes a plurality of control bits.

15. The electronic circuit according to claim 11, wherein the controller includes circuitry for measuring the current passing through the reference element and for generating a control signal representative of the measured current.

16. The electronic circuit according to claim 10, wherein the parameter detector further includes a step-down converter operably coupled to the buffer output, such that the voltage level output by the parameter detector is reduced.

17. The electronic circuit according to claim 16, wherein the parameter detector further includes at least one source follower that prevents high voltage levels from damaging circuitry in the parameter detector.

18. The electronic circuit according to claim 11, wherein the controller is located inside the parameter detector.

19. An electronic circuit, comprising:
   buffer means for receiving an input signal at a buffer input and for generating a buffered signal at a buffer output, the buffer means being responsive to the input signal and to a buffer control signal, and
   detector means for measuring a parameter at the buffer output when the buffer means is in a high impedance output state and for generating the buffer control signal based upon the measured parameter.

20. A method of calibrating a buffer, the method comprising:
   placing the buffer in a high impedance output state,
   measuring a parameter at the buffer output while the buffer is in the high impedance output state, and
   adjusting the buffer based upon the measured parameter.

21. The method according to claim 20, further including the steps of:
   generating a buffer control signal based upon the measured parameter, and
   adjusting the buffer based upon the buffer control signal such that the buffer generates a buffered signal based upon an input signal and the buffer control signal.

22. The method according to claim 21, wherein the generating step further includes the step of generating a buffer control signal having a plurality of control bits.

23. The method according to claim 20, further including the step of placing the buffer in a high impedance output state and measuring a parameter at the buffer output in response to a calibration signal.

24. The method according to claim 20, wherein the adjusting step further includes selectively engaging a transistor in the buffer based upon the measured parameter.

25. The method according to claim 20, wherein the measuring step further includes determining a voltage level at the buffer output.

26. The method according to claim 25, wherein the step of determining the voltage level further includes operably coupling the buffer output to a reference element.

27. The method according to claim 26, wherein the step of determining the voltage level further includes the step of generating a control signal representative of the voltage level across the reference element.

28. The method according to claim 20, wherein the measuring step further includes measuring a current level at the buffer output.

29. The method according to claim 20, further including the step of operably coupling the buffer output to a resistor having an unknown resistance prior to the measuring step, such that the buffer is adjusted based upon the unknown resistance of the resistor.

30. The method according to claim 20, wherein the step of placing the buffer in a high impedance output state includes turning off at least one of the transistors in the output stage of the buffer.

* * * * *